(12) United States Patent
Jan

(10) Patent No.: US 8,816,414 B2
(45) Date of Patent: Aug. 26, 2014

(54) MODULE STRUCTURE WITH PARTIAL PIERCED SUBSTRATE

(71) Applicant: LarView Technologies Corporation, Taoyuan County (TW)

(72) Inventor: Shin-Dar Jan, Hsinchu (TW)

(73) Assignee: LarView Technologies Corporation, Yangmei, Taoyuan County (TW)

( * ) Notice: Subject to any disclaimer, the term of this patent is extended or adjusted under 35 U.S.C. 154(b) by 128 days.

(21) Appl. No.: 13/669,055

(22) Filed: Nov. 5, 2012

(65) Prior Publication Data

US 2014/0124887 A1    May 8, 2014

(51) Int. Cl.
*H01L 31/062* (2012.01)
*H01L 31/113* (2006.01)
*H01L 31/0232* (2014.01)

(52) U.S. Cl.
CPC ................................ *H01L 31/0232* (2013.01)
USPC ......................................... 257/292; 257/294

(58) Field of Classification Search
USPC ................... 257/290–294, E31.073, E31.127
See application file for complete search history.

(56) References Cited

U.S. PATENT DOCUMENTS

| | | | |
|---|---|---|---|
| 7,005,310 B2 * | 2/2006 | Hanada et al. | 438/25 |
| 8,033,446 B2 * | 10/2011 | Wada et al. | 257/778 |
| 8,045,026 B2 * | 10/2011 | Abe | 257/291 |
| 8,519,457 B2 * | 8/2013 | Sekine et al. | 257/292 |

* cited by examiner

*Primary Examiner* — Cuong Q Nguyen
(74) *Attorney, Agent, or Firm* — Chih Feng Yeh; Huntington IP Consulting Co., Ltd

(57) ABSTRACT

The present invention provides a module structure comprising a substrate with a partial pierced region. A main chip has a sensing area. At least one component is included, wherein the main chip, the at least one component and the substrate are located at the same level. A holder is disposed on the substrate. A transparent material is disposed on the holder, substantially aligning to the sensing area. A lens holder is disposed on the holder, and a lens is configured on the lens holder, substantially aligning to the transparent material and the sensing area.

18 Claims, 8 Drawing Sheets

MODULE STRUCTURE WITH PARTIAL PIERCED SUBSTRATE

TECHNICAL FIELD

The present invention generally relates to a semiconductor device module structure, more particularly, to a module structure with a partial pierced substrate by utilizing a partial pierced substrate to reduce the height and size of the module structure.

BACKGROUND

A traditional camera module includes an image sensor and one or more lens set. The lens set is disposed above the image sensor for the incident ray image mapping to the image sensor. Camera module with the image sensor can be applied to digital cameras, digital video recorders, mobile phones, smart phones, monitors and others electronic products with camera function.

For camera module, in order to ensure the image quality, it needs to strictly control the factors of affecting imaging quality to meet the requirement of higher and higher resolution of the lens module. The current design of the camera module, the image sensor chip and others active components or passive components are placed on a substrate, and therefore increasing the size and height of the module structure. And, in order to enhance the image quality and image processing speed, the number of the active components and the passive components will increase. As the space of the top surface of the original substrate is not enough to accommodate the components, it needs to increase the size of the original substrate. This is inconsistent with the requirements of the current trend of miniaturization of the electronic products.

Therefore, based-on the shortcomings of prior arts, the present invention provide a newly module structure with a partial pierced substrate to reduce the size and height of the module structure.

SUMMARY OF THE INVENTION

Based-on the shortcomings of the above-mentioned, an objective of the present invention is to provide a holder on chip module structure by integrating active/passive components, an image sensor chip and a partial pierced substrate to reduce the size and height of the module structure.

According to an aspect of the present invention, the present invention provides a module structure with a partial pierced substrate. The module structure comprises a substrate, having a pierced region. A main chip has a sensing area. At least one component is included, wherein the main chip and the at least one component are disposed on the pierced region of the first substrate, wherein the main chip, the at least one component and the first substrate locate at the same level. A first holder is disposed on the first substrate. A transparent material is disposed on the first holder, substantially aligning to the sensing area. A lens holder is disposed on the first holder, and a lens is configured on the lens holder, substantially aligning to the transparent material and the sensing area.

The pierced region includes a center area and two side areas, wherein the center area is for accumulating the main chip and the two side areas are for accumulating the at least one component.

According to another aspect of the present invention, the pierced region includes a center area and a first side area, wherein the center area is for accumulating the main chip and the first side area is for accumulating a first component of the at least one component. The at least one component includes the first component and a second component, and the second component is disposed on the top surface of a second side non-pierced region of the first substrate.

The lens holder is a plastic piece or an actuator, wherein the actuator includes a voice coil motor or a micro electro mechanical system.

According to another aspect of the present invention, the module structure further comprises a second substrate, wherein the main chip, the at least one component and the substrate are disposed on the first substrate.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention provides a module structure with a partial pierced substrate to reduce the height of the module structure by utilizing a partial pierced substrate. In other words, for the module structure, the substrate has a pierced region for facilitating an image sensor chip and an active component and/or a passive component disposed thereon. That is, the image sensor chip, the active component and/or passive component and the substrate are disposed on an identical level or layer, and thereby effectively reducing the height and size of the whole module structure.

Figure 1:
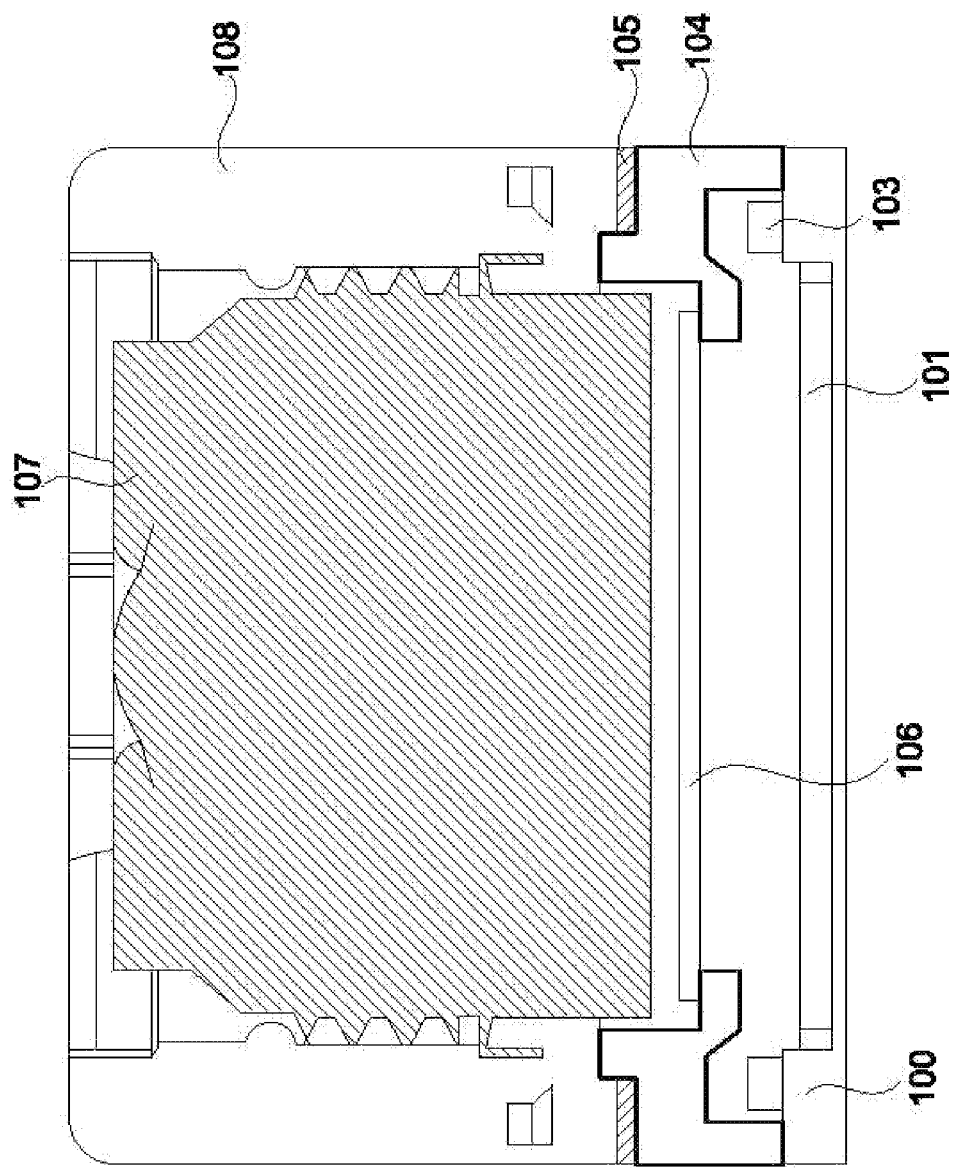
FIG. 1 illustrates a sectional view of a chip module structure by integrating active/passive components, an image sensor chip and a substrate.

FIG. 1 shows a sectional view of a chip module structure by integrating an active component/passive component, an image sensor chip and a substrate. As shown in FIG. 1, the lens holder integrates the active component/passive component, image sensor chip and the substrate to be as a module structure with sensing function, which can be applied to a camera module of a mobile phone. The chip module structure comprises a substrate 100, a chip 101, an active component/passive component 103, a supporting holder 104, a transparent plate (material) 106, a lens 107 and a lens holder 108.

In the present invention, the lens holder 108 integrates the lens 107, the transparent plate 106, the supporting holder 104, the active component/passive component 103, the chip 101 and the substrate 100 to form a cubic module structure.

The lens holder 108 may be a plastic piece or an actuator adhered on the supporting holder 104, and the supporting holder 104 is adhered to the substrate 100 to complete the module structure of the present invention. For example, the actuator includes a voice coil motor (VCM) or a micro electro mechanical system (MEMS) structure. Currently, in the imaging apparatus, the voice coil motor is generally applied to drive lens of the camera module for focusing.

The substrate 100 has a groove structure for facilitating the chip 101 disposed thereon. The chip 101 may be adhered on (to) the groove structure of the substrate 100 via a conductive layer or a non-conductive adhesion layer. The conductive layer may be as the adhesion layer to form on the substrate 100. In one embodiment, material of the conductive layer includes a conductive paste or a conductive film, which may be formed as a pattern paste on the substrate by employing a printing or coating process. The conductive layer may be optically coated on the substrate 100. For example, the chip 100 is an image sensor chip which has a sensing area on the top surface and a contact pad formed thereon. The substrate 100 is a printed circuit board or a flexible printed circuit board. Size of the substrate 100 is larger than that of the chip 101 such that the chip 101 can be completely adhered on the substrate 100.

An adhesion layer (not shown) is formed on (side of) the substrate 100. The holder 104 is adhered on the substrate 100 via the adhesion layer, and the chip 101 is configured between the holder 104 and the substrate 100. The holder 104 has a groove structure formed therein for receiving or accumulating the chip 101 and the active component/passive component 103, and a through hole structure with an opening area for exposing the sensing (active) area and the contact pad of the chip 101. The chip 101 is disposed on the groove structure of the substrate 100, and the active component/passive component 103 is disposed on the top surface of the side of the substrate 100.

Moreover, the holder 104 has a ring groove structure located at a side of the through hole structure, which has a space for the transparent plate 106 disposed thereon. That is, the holder 104 can support the transparent plate 106. The transparent plate 106 is for example a glass substrate or the plate made of a transparent material. The transparent plate 106 is located above the substrate 100 for covering the sensing area of the image sensor chip 101, and thereby creating a gap between the transparent plate 106 and the sensing area. The transparent plate 106 covers the sensing area of the image sensor chip 101 to reduce particles contamination for enhancing yield of the module structure. Size of the transparent plate 106 may be the same or larger than area of the sensing area.

The transparent plate (glass substrate) 106 may be round or square type. The transparent plate (glass substrate) 106 may be optionally coated infrared coating layer for filtering, such as infrared filter for filtering to a certain band of frequency by passing through the lens 107.

An adhesion layer 105 is formed on (side of) the holder 104. The bottom of the lens holder 108 is adhered on the supporting holder 104 via the adhesion layer 105. The lens 107 is fixed to the lens holder 108 for supporting the lens 107. Moreover, the lens holder 108 may be fixed to the supporting holder 104 for supporting the lens 107. In the module structure of this embodiment, the transparent plate 106 may be optionally disposed under the lens holder 108, and between the lens 107 and the chip 101. In other words, the lens 107 is substantially aligning to the transparent plate 106 and the chip 101.

Figure 2:
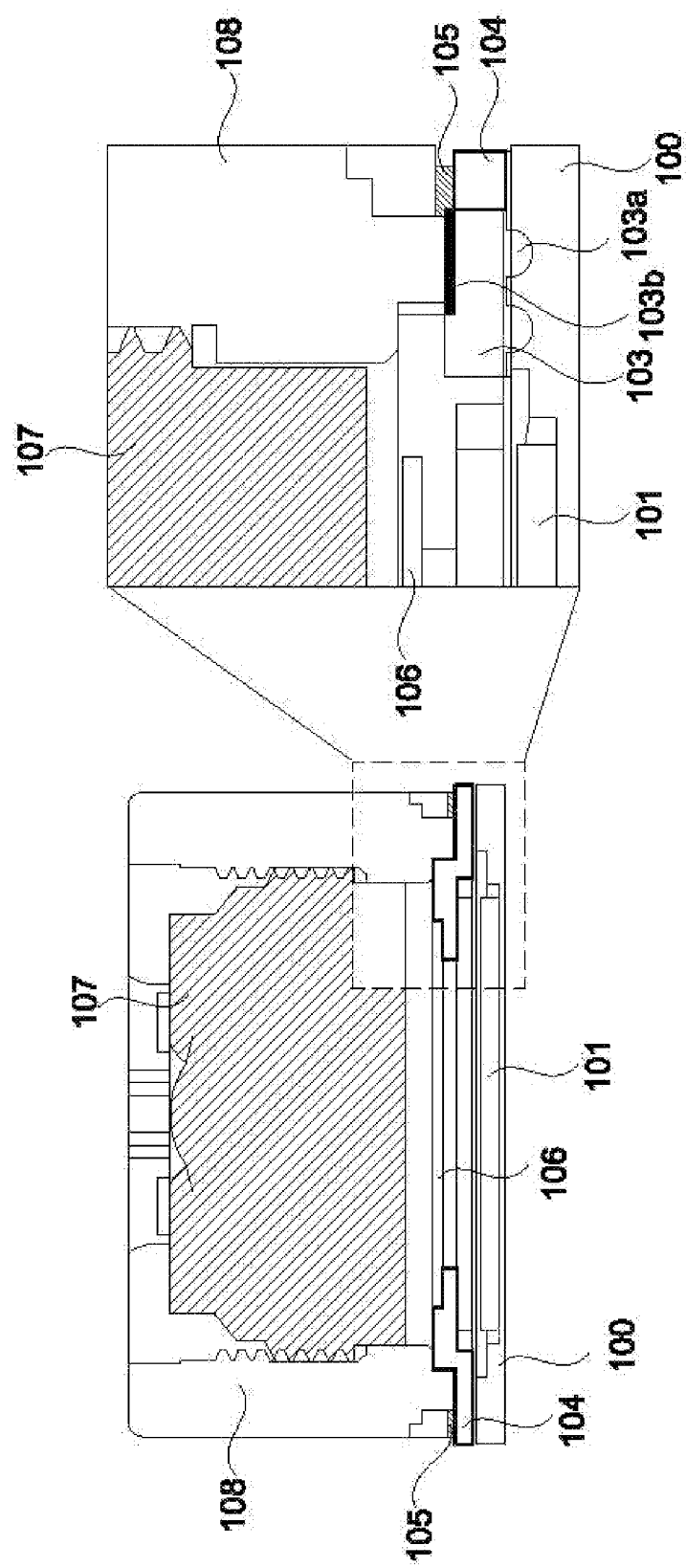
FIG. 2 illustrates a sectional view of a chip module structure by integrating active/passive components, an image sensor chip and a substrate.

As mentioned above, the chip 101 is disposed on the groove structure of the substrate 100, and the active component/passive component 103 is disposed on the top surface of the side of the substrate 100. In one embodiment, as the number of the active/passive components 103 increase, while the space of the top surface of the original substrate 100 is insufficient to accommodate all of the active/passive components 103. It needs to increase the size of the original substrate 100. For example, the component 103 is a driver IC disposed on the top surface of the side of the substrate 100, and the top surface 103b of the driver IC 103 contacts to the bottom of the lens holder 108. The driver IC 103 is coupled to the top surface of the substrate 100 via solder balls 103a. Therefore, the component 103 is located between the lens holder 108 and the substrate 100. As shown in FIG. 2, to maintain the height of the original design of the module structure, there will be some overlapping between the element 103 and the lens holder 108. To resolve the problem of overlapping of the lens holder 108, the height of the module structure will be increased, as shown in FIG. 2.

Figure 3:
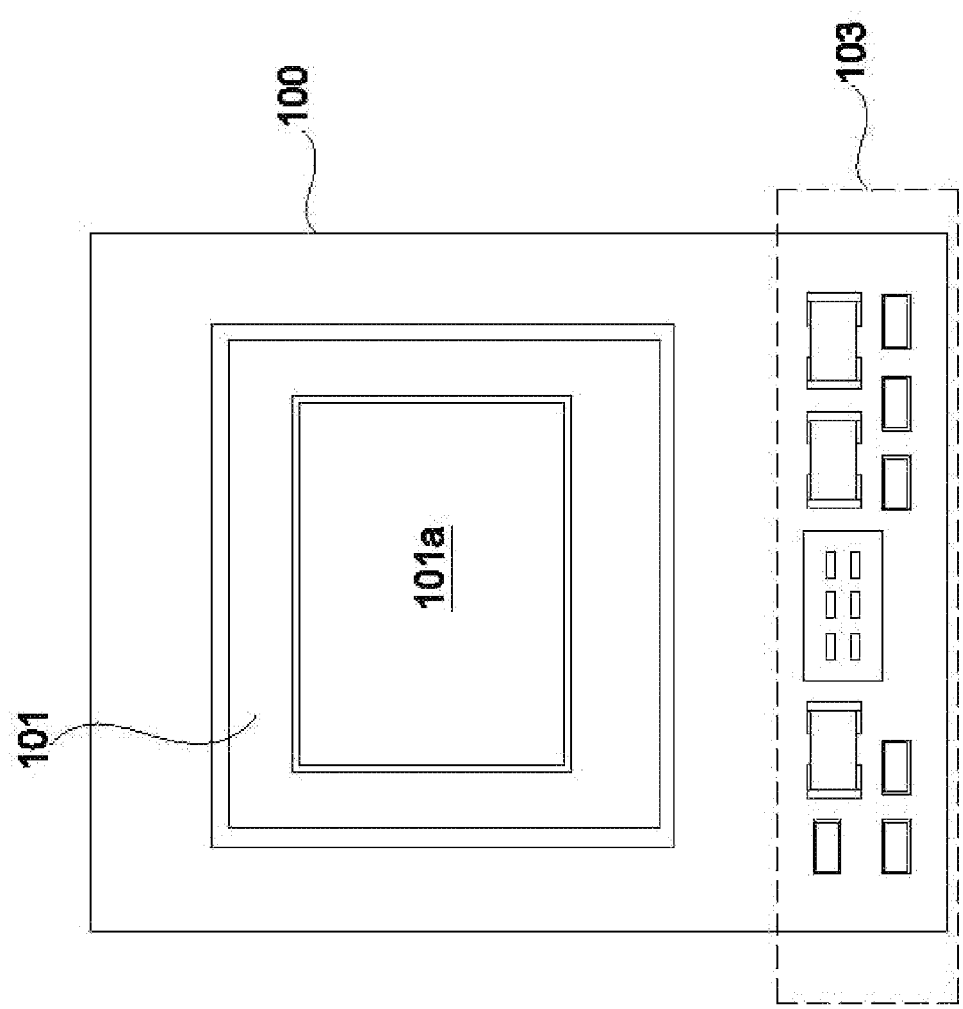
FIG. 3 illustrates a chip module structure by integrating active/passive components, an image sensor chip and a substrate.

In another embodiment, the active/passive components (all elements within the dashed line) 103 are disposed on one side of the substrate 100 except the mater chip 101, which increases the size of the module structure, shown in FIG. 3. As shown in FIG. 3, the image sensor chip 101 has a sensing area 101a, disposed on the groove structure of the substrate 100.

Figure 4:
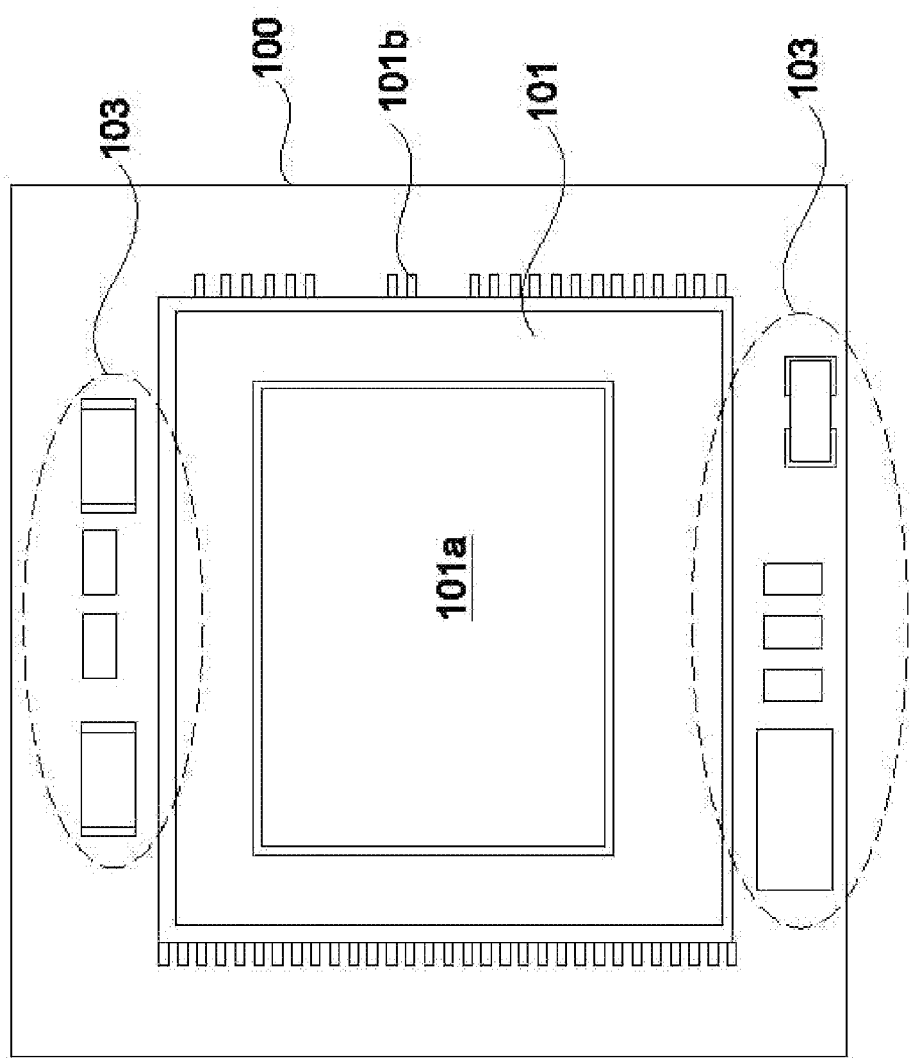
FIG. 4 illustrates a chip module structure by integrating active/passive components, an image sensor chip and a substrate.
Figure 5:
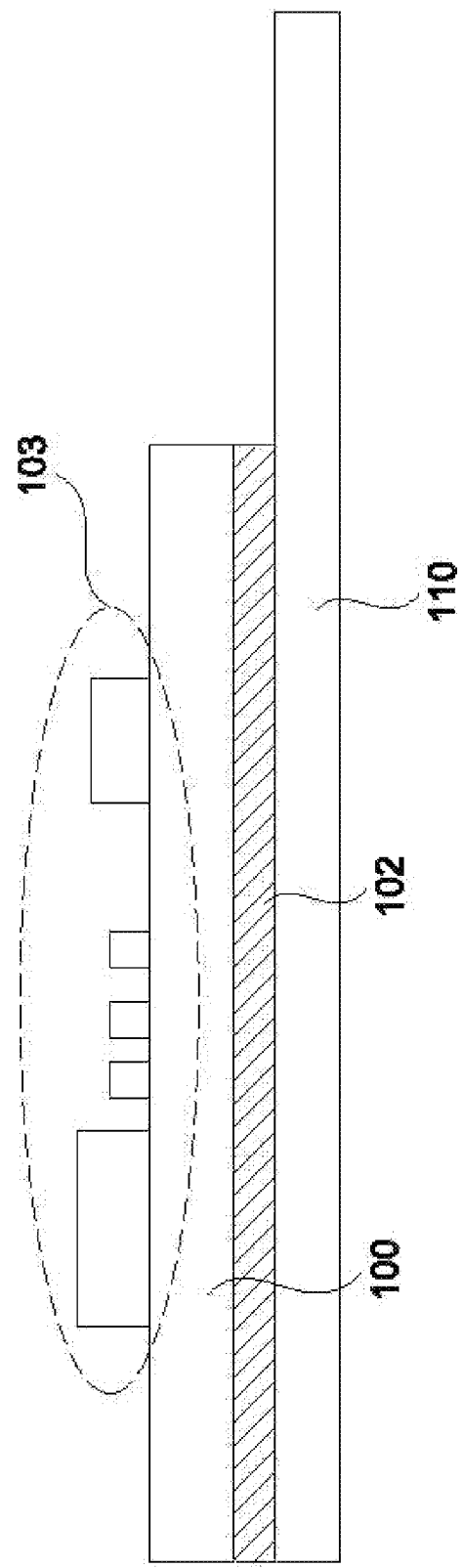
FIG. 5 illustrates a sectional view of active/passive components formed on a substrate.

In yet another embodiment, the active/passive components (all elements within the dashed line) 103 are disposed on two side of the substrate 100 except the mater chip 101, shown in FIG. 4. Similarly, due to the active/passive components 103 disposed on the top surface of the outer side of the substrate 100, and therefore the size and height of the module structure will be increased, shown in FIG. 5. the image sensor chip 101 has a sensing area 101a, disposed on the groove structure of the substrate 100. The substrate 100 is adhered to the surface of another substrate 110 via a conductive layer 102. The conductive layer 102 layer may be as the adhesion layer to form on the substrate 110. In one embodiment, material of the conductive layer includes a conductive paste or a conductive film, which may be formed as a pattern paste on the substrate 110 by employing a printing or coating process. In FIG. 4, the substrate 100 has contact pads 101b for electrically connecting to other component.

Figure 6:
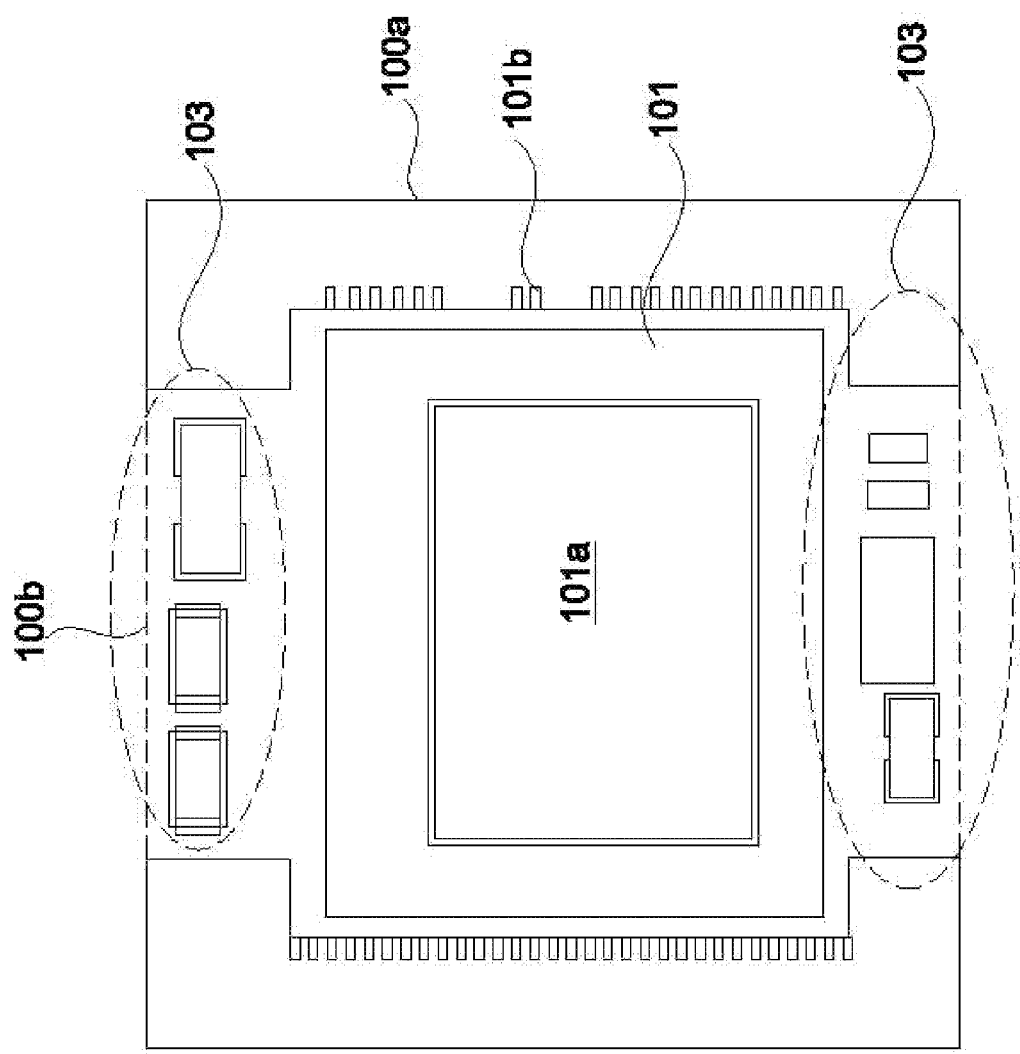
FIG. 6 illustrates a chip module structure with a partial pierced substrate by integrating active/passive components, an image sensor chip and a substrate.
Figure 8:
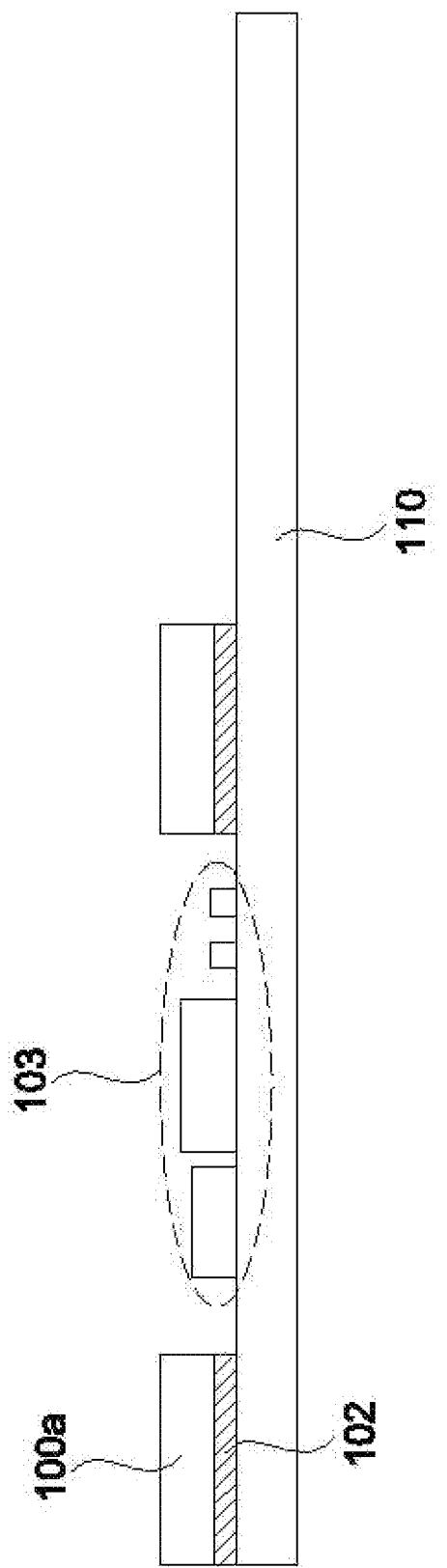
FIG. 8 illustrates a sectional view of the active/passive components, an image sensor chip and a partial pierced substrate formed on a substrate.

As shown in FIG. 6, it shows a module structure with a partial pierced substrate according to an embodiment of the present invention. In this embodiment, the difference between the substrate 100a structure and the substrate 100 structure of the FIG. 4 is that the substrate 100a structure has a pierced region 100b and the substrate 100 has no pierced region. The substrate 100 has a groove portion (region) formed therein for receiving or accumulating the chip 101, and the component 103 is disposed on the top surface of the substrate 100. The pierced region 100b of the substrate 100a locates at a center area and two side areas of the substrate 100a, wherein the pierced region of the center area may be for accumulating the chip 101 such that the chip 101 is disposed thereon, and the pierced region of the two sides areas may be for accumulating the component 103 such that the component 103 is disposed thereon. In this embodiment, the main chip 101, the component 103 and the substrate 100a are located at the identical level or layer, as shown in FIG. 8. For example, in FIG. 8, the image sensor chip 101 (not shown in FIG. 8), the component 103 and the substrate 100a are disposed on the substrate 110. Therefore, in the module structure, the height of the image sensor chip 101 and the component 103 do not affect the size of the overall module structure in X, Y and Z directions. The substrate 100a is adhered to the surface of the substrate 110 via the conductive layer 102. The substrate 110 is for example a printed circuit board or a flexible printed circuit board. In one embodiment, number of the substrate 110 may be one, two or more circuit boards. In other words, in the example for plurality of circuit boards, the image sensor chip 101 and the component 103 may be optionally disposed on any one circuit board of the substrate 110. The substrate 110 may extend outside of the cubic module structure for facilitating coupling to the external electronic element.

In another embodiment, the substrate 100a structure has a pierced region 100c which includes a center area and a single side area, wherein the pierced region of the center area may be for accumulating the chip 101 such that the chip 101 is disposed thereon, and the pierced region of the signal side area may be for accumulating the component 103 such that the component 103 is disposed thereon. The other side of the substrate 100a has no pierced region, and the component 103 is disposed on the top surface of the other side of the substrate 100a. In this embodiment, the image sensor chip 101, the component 103 and the substrate 100a are located at the identical level or layer, as shown in FIG. 8. For example, in FIG. 8, the image sensor chip 101 (not shown in FIG. 8), the component 103 and the substrate 100a are disposed on the substrate 110, and the component 103 (not shown in FIG. 8) is disposed on the top surface of the other side of the substrate 100a.

Figure 7:
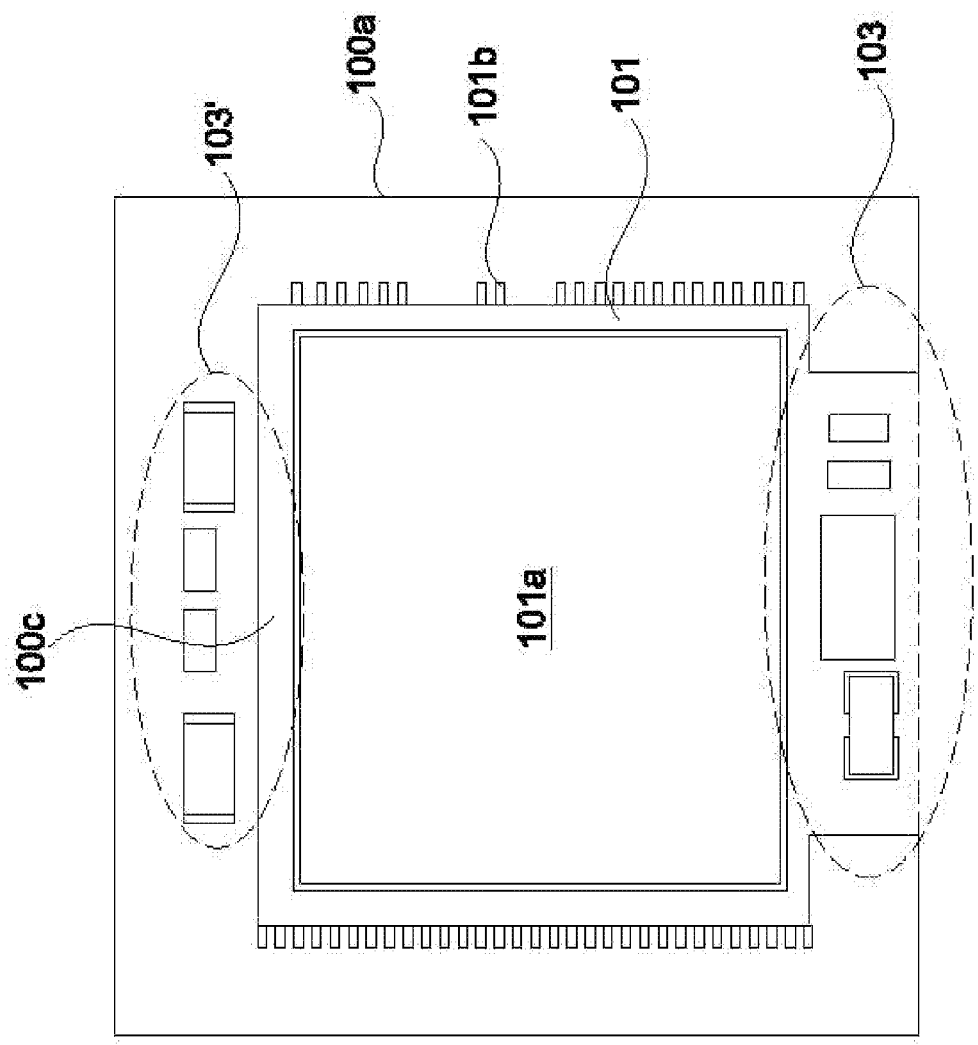
FIG. 7 illustrates a chip module structure with a partial pierced substrate by integrating active/passive components, an image sensor chip and a substrate.

As mentioned above, in the assembled module structure of the FIG. 6 and FIG. 7, the image sensor chip 101, the component 103 and the substrate 100a are disposed on the same level or layer, and thus reducing the height (thickness) of the module structure.

In one embodiment of the present invention, the substrate 100 is a printed circuit board. Besides, the substrate 100 may be an organic substrate, and which material includes, for example epoxy type FR5 or FR4, or BT (Bismaleimide Triazine). Moreover, glass, ceramic and silicon may be as material of the substrate 100.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A module structure with a partial pierced substrate, comprising:
   a first substrate, having a pierced region;
   a main chip, having a sensing area;
   at least one component, wherein said main chip and said at least one component are disposed on said pierced region of said first substrate, wherein said main chip, said at least one component and said first substrate locate at the same level;
   a first holder disposed on said first substrate; and
   a lens holder disposed on said first holder, and a lens configured on said lens holder, substantially aligning to said sensing area.

2. The module structure of claim 1, wherein said pierced region includes a center area and two side areas, wherein said center area is for accumulating said main chip and said two side areas are for accumulating said at least one component.

3. The module structure of claim 1, wherein said pierced region includes a center area and a first side area, wherein said center area is for accumulating said main chip and said first side area is for accumulating a first component of said at least one component.

4. The module structure of claim 3, wherein said at least one component includes said first component and a second component, and said second component is disposed on the top surface of a second side non-pierced region of said first substrate.

5. The module structure of claim 1, wherein said lens holder is a plastic piece or an actuator.

6. The module structure of claim 5, wherein said actuator includes a voice coil motor or a micro electro mechanical system.

7. The module structure of claim 1, further comprising a second substrate, wherein said main chip, said at least one component and said substrate are disposed on said first substrate.

8. The module structure of claim 7, wherein said pierced region includes a center area and two side areas, wherein said center area is for accumulating said main chip and said two side areas are for accumulating said at least one component.

9. The module structure of claim 7, wherein said pierced region includes a center area and a first side area, wherein said center area is for accumulating said main chip and said first side area is for accumulating a first component of said at least one component.

10. The module structure of claim 9, wherein said at least one component includes said first component and a second component, said second component is disposed on the top surface of a second side non-pierced region of said first substrate.

11. The module structure of claim 7, wherein said lens holder is a plastic piece or an actuator.

12. The module structure of claim 11, wherein said actuator includes a voice coil motor or a micro electro mechanical system.

13. The module structure of claim 1, further comprising a transparent material disposed on said first holder, substantially aligning to said sensing area.

14. The module structure of claim 13, wherein said pierced region includes a center area and two side areas, wherein said center area is for accumulating said main chip and said two side areas are for accumulating said at least one component.

15. The module structure of claim 13, wherein said pierced region includes a center area and a first side area, wherein said center area is for accumulating said main chip and said first side area is for accumulating a first component of said at least one component.

16. The module structure of claim 15, wherein said at least one component includes said first component and a second component, said second component is disposed on the top surface of a second side non-pierced region of said first substrate.

17. The module structure of claim 13, wherein said lens holder is a plastic piece or an actuator.

18. The module structure of claim 17, wherein said actuator includes a voice coil motor or a micro electro mechanical system.

* * * * *